(12) United States Patent
Devendorf et al.

(10) Patent No.: US 7,154,421 B2
(45) Date of Patent: Dec. 26, 2006

(54) DNL/INL TRIM TECHNIQUES FOR COMPARATOR BASED ANALOG TO DIGITAL CONVERTERS

(75) Inventors: Don C. Devendorf, Carlsbad, CA (US); Erick M. Hirata, Torrance, CA (US); Lloyd F. Linder, Agoura Hills, CA (US)

(73) Assignee: TelASIC Communications, Inc., El Segundo, CA (US)

( * ) Notice: Subject to any disclaimer, the term of this patent is extended or adjusted under 35 U.S.C. 154(b) by 28 days.

(21) Appl. No.: 10/890,443

(22) Filed: Jul. 12, 2004

(65) Prior Publication Data

US 2005/0128118 A1 Jun. 16, 2005

Related U.S. Application Data

(60) Provisional application No. 60/529,334, filed on Dec. 12, 2003.

(51) Int. Cl.
*H03M 1/06* (2006.01)

(52) U.S. Cl. ............. 341/118; 341/155; 341/120; 327/108

(58) Field of Classification Search ............ 341/155, 341/118, 120, 121, 144, 158; 327/108; 330/256
See application file for complete search history.

(56) References Cited

U.S. PATENT DOCUMENTS

| | | | | |
|---|---|---|---|---|
| 3,725,673 A | * | 4/1973 | Frederiksen et al. | 327/89 |
| 4,827,222 A | * | 5/1989 | Hester et al. | 330/257 |
| 4,973,917 A | * | 11/1990 | Johnson | 330/254 |
| 5,254,956 A | * | 10/1993 | Nishijima | 330/258 |
| 5,365,191 A | * | 11/1994 | Hayashi | 330/252 |
| 5,563,598 A | * | 10/1996 | Hickling | 341/155 |
| 5,631,603 A | * | 5/1997 | Stubbe et al. | 330/9 |
| 5,736,885 A | * | 4/1998 | Wietecha et al. | 327/307 |
| 5,757,234 A | * | 5/1998 | Lane | 330/256 |
| 6,313,704 B1 | * | 11/2001 | Maruyama et al. | 330/259 |
| 6,628,150 B1 | * | 9/2003 | Carvajal et al. | 327/108 |
| 6,778,113 B1 | * | 8/2004 | Xu et al. | 341/144 |
| 6,882,207 B1 | * | 4/2005 | Fujiyama et al. | 327/307 |
| 2004/0178846 A1 | * | 9/2004 | Kuyel et al. | 330/9 |

FOREIGN PATENT DOCUMENTS

JP 07131260 * 10/1995

* cited by examiner

*Primary Examiner*—Peguy JeanPierre
(74) *Attorney, Agent, or Firm*—Morrison & Foerster LLP (57) ABSTRACT

A trimmable comparator. The novel comparator includes a first circuit for comparing first and second input signals and in accordance therewith generating first and second output signals, and a second circuit for adding an adjustable current to the first output signal such that the comparator is in a transition state when the first and/or second input signals are at desired levels. The comparator may also include a third circuit for adding an adjustable current to the second output signal. In the illustrative embodiments, the second and third circuits are implemented using adjustable current sources with trimmable resistors, or using digital to analog converters. The novel comparators may be used in an analog to digital converter to allow the converter thresholds to be adjusted to desired levels.

28 Claims, 5 Drawing Sheets

DNL/INL TRIM TECHNIQUES FOR COMPARATOR BASED ANALOG TO DIGITAL CONVERTERS

CROSS-REFERENCE TO RELATED APPLICATIONS

This application claims the benefit of U.S. Provisional Application No. 60/529,334, filed Dec. 12, 2003, the disclosure of which is hereby incorporated by reference.

BACKGROUND OF THE INVENTION

1. Field of the Invention

The present invention relates to electronics. More specifically, the present invention relates to comparators and analog to digital converters.

2. Description of the Related Art

Analog to digital converters are widely used for converting analog signals to corresponding digital signals for many electronic circuits. For example, a high resolution, high speed analog to digital converter (ADC) may find application in broadband communications, video circuits, radar, and electronic warfare applications.

The fastest ADC architecture is called "flash" conversion. A flash ADC produces an N-bit digital output in one step using a comparator bank comprised of $2^N-1$ parallel comparators. Each comparator compares the analog input signal with a different threshold level. The thresholds are typically generated using a resistive ladder or voltage divider. Due to process variables, the multiple resistors of the voltage divider cannot be fabricated to exact values. The voltages generated by the resistive ladder will therefore differ slightly from the desired threshold levels. In addition, the comparators typically also have imperfections, such as imprecise current sources and base currents that affect the resistive ladder. These inaccuracies cause the comparators to change states at the wrong times, generating differential nonlinearity (DNL) and integral nonlinearity (INL) distortions in the system.

A flash ADC may be used by itself, or it may be part of a larger ADC, such as a subranging ADC. In either case, any errors introduced by the flash ADC will propagate through the entire conversion process, creating distortions in the digital output. For a high precision ADC, these errors cannot be tolerated.

The conventional solution to this problem is to trim the resistors of the voltage divider using a large external (hybrid) circuit. The resistive ladder by itself cannot be trimmed to correct any individual threshold because trimming one threshold will affect all the other thresholds. The conventional trimming circuit therefore uses a separate resistor chain for each comparator. This approach utilizes significant surface die area and high power consumption. While this solution achieves the desired accuracies for low resolution (up to about 4–5 bit) ADCs, it is impractically large for larger resolution ADCs. An eight-bit ADC, for example, would need a resistor chain for each of its 255 comparators. Furthermore, this approach is applicable only to single-ended implementations. There is no equivalent approach in the prior art for zeroing errors in a differentially driven comparator bank.

Hence, there is a need in the art for an improved system or method for trimming a flash ADC offering smaller size and lower power consumption than prior art approaches, which is suitable for single-ended or differentially driven high resolution ADCs.

SUMMARY OF THE INVENTION

The need in the art is addressed by the trimmable comparator of the present invention. The novel comparator includes a first circuit for comparing first and second input signals and in accordance therewith generating first and second&output signals, and a second circuit for adding an adjustable current to the first output signal such that the comparator is in a transition state when the first and/or second input signals are at desired levels. The comparator may also include a third circuit for adding an adjustable current to the second output signal. In the illustrative embodiments, the second and third circuits are implemented using adjustable current sources with trimmable resistors, or using digital to analog converters. The novel comparators may be used in an analog to digital converter to allow the converter thresholds to be adjusted to desired levels.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1A:
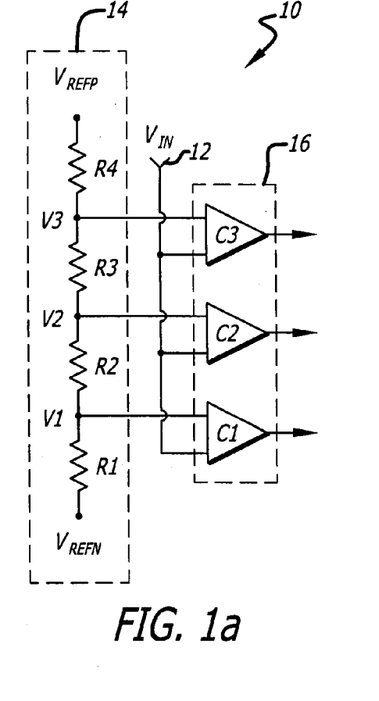
FIG. 1 is a simplified schematic of an illustrative single-ended flash ADC.

FIG. 1a is a simplified schematic of an illustrative single-ended flash ADC 10. The ADC 10 includes an input terminal 12, a resistive ladder 14, and a comparator bank 16 comprised of a plurality of comparators C1, C2, and C3. For simplicity, a two-bit ADC 10 having only three comparators C1, C2, and C3 is shown in FIG. 1a. The teachings of the present invention are, of course, applicable to higher resolution ADCs.

The ADC 10 receives an analog input signal $V_{IN}$ at the input terminal 12, which is coupled to one input of each comparator C1, C2, and C3. The second inputs of the comparators C1, C2, and C3 are tapped from the resistive ladder 14, which includes a plurality of resistors R1, R2, R3, and R4 connected in series between a first reference voltage $V_{REFN}$ and a second reference voltage $V_{REFP}$. As shown in FIG. 1a, a first node V1 between resistors R1 and R2 is coupled to the second input of comparator C1, a second node V2 between R2 and R3 is coupled to the second input of comparator C2, and a third node V3 between R3 and R4 is coupled to the second input of comparator C3. The comparator bank 16 therefore compares the input signal $V_{IN}$ with a number of threshold voltages provided by the resistive ladder 14. The outputs of the comparator bank 16 can then be encoded by a binary encoder (not shown) to produce a digital output.

If the comparators C1, C2, and C3 had no offset errors (i.e. they switched states when their two inputs were equal) and the resistor values for R1 through R4 were exactly equal, the voltages at nodes V1, V2, and V3 would be separated, by the same voltage ΔV. The problem here is that the resistors R1, R2, R3, and R4 are not exact and/or the comparators C1, C2, and C3 have slight variations in switching voltages at their inputs. This is due to process variations. It is not practical to adjust the voltages at V1, V2 and V3 so that the comparators C1, C2, and C3 switch at precisely the correct voltage (a requirement to minimize DNL and INL errors), since adjusting one resistor will affect all voltages.

Figure 1B:
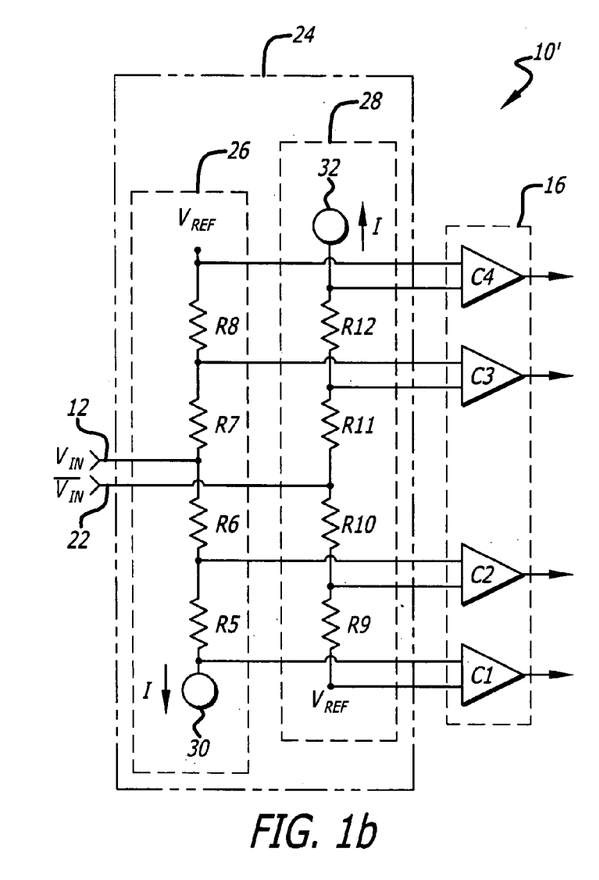
FIG. 1b is a simplified schematic of an illustrative differentially driven flash ADC.

FIG. 1b is a simplified schematic of an illustrative differentially driven flash ADC 10'. The ADC 10' includes a positive input terminal 12, a negative input terminal 22, a resistive network 24, and a comparator bank 16 comprised of a plurality of comparators C1, C2, C3, and C4. The resistive network 24 spreads a differential analog input signal received by the input terminals 12 and 22 amongst the comparators C1, C2, C3, and C4. The resistive network 24 includes two equal and independent resistor ladders 26 and 28, which spread the positive and negative inputs of the differential input signal. The resistor ladder 26 includes a plurality of resistors R5, R6, R7, and R8 connected in series between a current source 30 of value I and a reference voltage $V_{REF}$. The resistor ladder 28 includes a plurality of resistors R9, R10, R11, and R12 connected in series between a current source 32 of value I and the reference voltage $V_{REF}$. An input signal $V_{IN}$ received by the positive input terminal 12 is applied to the resistive ladder 26 between resistors R6 and R7, and the input signal $\overline{V}_{IN}$ (which is the complement of $V_{IN}$) received by the negative input terminal 22 is applied to the resistive ladder 28 between resistors R10 and R11.

The comparators C1, C2, C3, and C4 compare signals tapped from both resistor ladders 26 and 28. The two inputs to comparator C1 are tapped from the node between the current source 30 and resistor R5 in the first ladder 26, and the node between $V_{REF}$ and R9 in the second ladder 28. The inputs to comparator C2 are tapped from the node between R5 and R6 in the first ladder 26, and the node between R9 and R10 in the second ladder 28. The inputs to comparator C3 are tapped from the node between R7 and R8 in the first ladder 26, and the node between R11 and R12 in the second ladder 28. The inputs to comparator C4 are tapped from the node between R8 and $V_{REF}$ in the first ladder 26, and the node between R12 and the current source 32 in the second ladder 28. All of the resistors are of equal value R except for the resistors on either side of the input terminals 12 and 22 (i.e. the resistors R6, R8, R10, and R11), which are of value R/2. The outputs of the comparator bank 16 can then be coupled to a binary encoder (not shown) for providing a digital output.

If the values of the resistors were exact and the comparators had no offset, then the comparators would switch at the following voltages:
C1: $\overline{V}_{IN} < V_{IN} - 3RI/2$
C2: $\overline{V}_{IN} < V_{IN} - RI/2$
C3: $V_{IN} < \overline{V}_{IN} - RI/2$
C4: $V_{IN} < \overline{V}_{IN} - 3RI/2$ As with the single-ended implementation, however, the comparators typically will not switch at precisely the correct voltages due to imperfections in the resistors and comparators. There is no practical method for trimming the resistor ladders 26 and 28 to compensate for process variations in a differential flash ADC.

Figure 2:
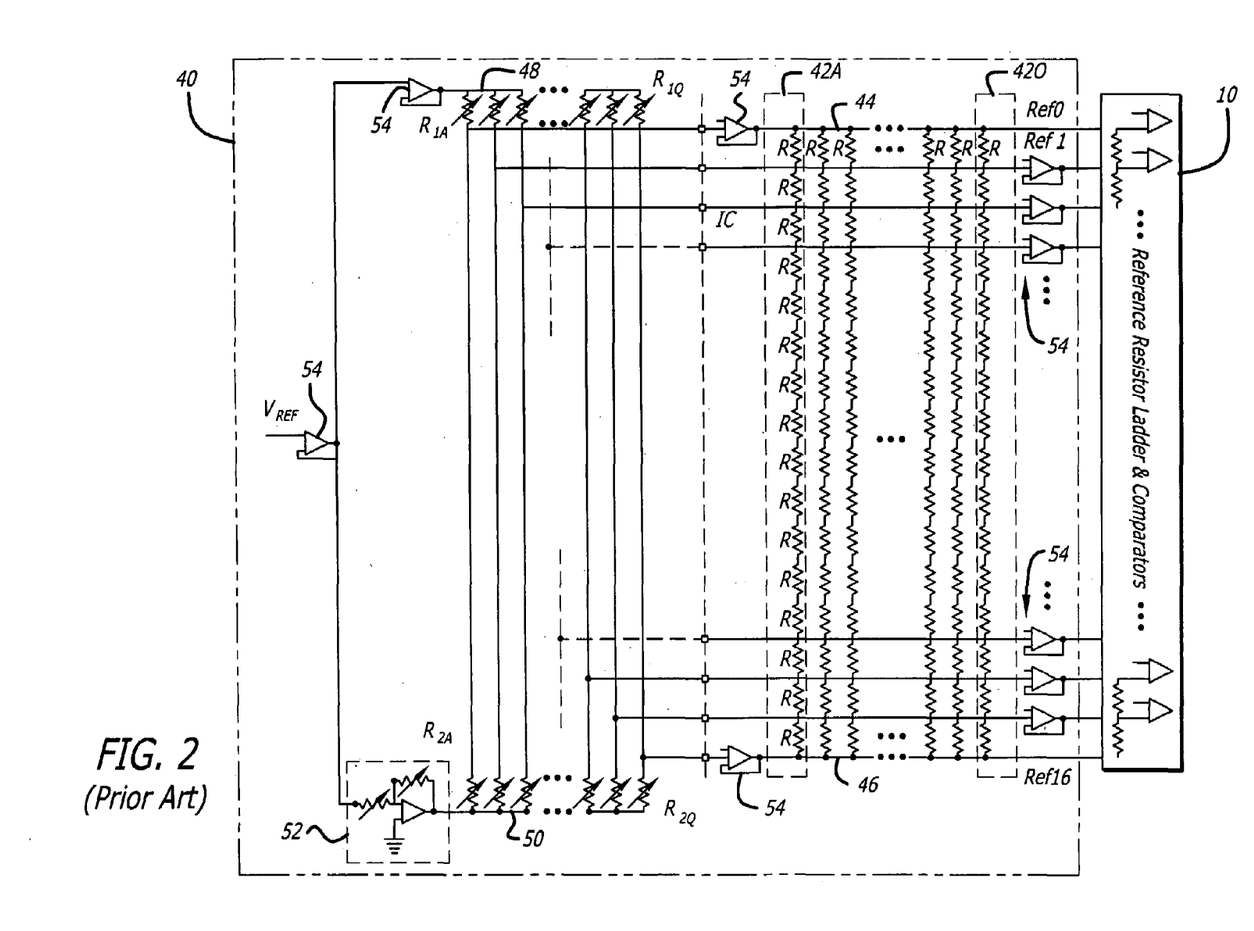
FIG. 2 is a simplified schematic of a conventional hybrid trimming circuit for a single-ended flash ADC.

FIG. 2 is a simplified schematic of a conventional hybrid trimming circuit 40 for a single-ended flash ADC 10 (such as the ADC shown in FIG. 1a). The trimming circuit 40 generates a plurality of individually trimmable reference voltages Ref0, Ref1 . . . , Ref16. In the example shown in FIG. 2, the trimming circuit 40 generates 17 reference voltages, which are coupled to the nodes of the voltage divider 14 of the ADC 10 (as shown in FIG. 1a) or input as the threshold voltages to the comparators of the ADC 10. Each reference voltage Refn (except the first reference Ref0 and last reference Ref16) is generated by a separate resistor ladder, labeled 42A through 42O. Each ladder 42n includes 16 resistors, each of value R, connected in series between a first node 44 and a second node 46. The first reference Ref0 is tapped from the first node 44, and the last reference Ref16 is tapped from the second node 46. The second reference Ref1 is tapped from the node between the first and second resistors of the first resistor ladder 42A, the third reference Ref2 is tapped from the node between the second and third resistors of the second resistor ladder 42B, etc.

The resistor ladders 42n are typically implemented on chip. The trimming circuit 40 also includes several external variable resistors for trimming the reference voltages Refn. The first node 44, the tapped nodes of the resistor ladders 42n, and the second node 46 are each connected between a first variable resistor (labeled $R_{1A}$ to $R_{1O}$) and a second variable resistor (labeled $R_{2A}$ to $R_{2O}$), which are connected in series between a third node 48 and a fourth node 50. A voltage supply $V_{REF}$ is coupled to the third node 48, and input to an inverting amplifier 52 with variable gain, the output of which is coupled to the fourth node 50. The circuit 40 also includes several buffer amplifiers 54 between $V_{REF}$ and the third node 48, between the first node and its variable resistors, between the second node and its variable resistors, and at the reference threshold outputs Ref1 to Ref15.

The conventional trimming approach therefore includes a very large number of resistors, which utilize significant surface die area and have high power consumption. The example trimming circuit 40 shown in FIG. 2 is for a four-bit ADC having only 15 comparators. The number of resistors required to individually trim every comparator threshold of a high resolution ADC, such as an eight-bit ADC having 255 comparators, is impractically large.

Figure 3:
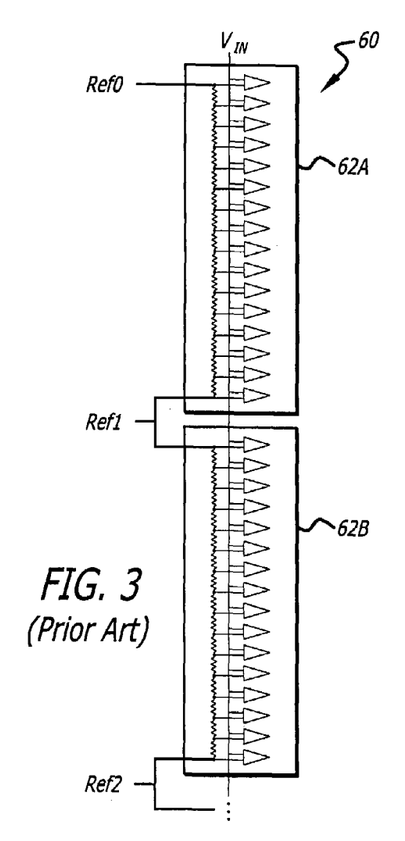
FIG. 3 is a simplified schematic of a single-ended flash ADC illustrating a conventional trimming approach for high resolution ADCs.

FIG. 3 is a simplified schematic of a single-ended flash ADC 60 illustrating a conventional trimming approach for high resolution ADCs. Instead of individually trimming every single threshold, this approach uses a trimming circuit, such as the hybrid circuit 40 of FIG. 2, to place a reference trim tap every $2^N/M$ thresholds apart, where N is the number of bits of the ADC and M is the number of reference voltages. As shown in FIG. 3, the ADC 60 includes a plurality of comparators divided into groups of 16 comparators (labeled 62A, 62B, etc.). The inputs to the comparators are the input signal $V_{IN}$ and a threshold voltage supplied by a resistor ladder, as shown in FIG. 1a. The trimmable reference voltages Ref0, Ref1, etc. generated by the hybrid trimming circuit 40 (as shown in FIG. 2) are coupled to the threshold input of every $16^{th}$ comparator.

With this trimming approach, threshold errors in between taps cannot be trimmed out due to the dependency on the trimmed voltage at this tap. For example, a design with reference taps every four comparators with errors from ideal of +2 mV, +3 mV, −1 mV, +1 mV and −2 mV can be trimmed but only to an average error for this section. If the end points are trimmed to zero error, then the deviation from ideal becomes 0, +2 mV, −1 mV, +2 mV and 0 [(2 mV−2 mV), (3 mV−2 mV×0.75+2 mV×0.25), (−1 mV−2 mV×0.5+2 mV×0.5), (+1 mV−2 mV×0.25+2 mV×0.75) and (−2 mV+2 mV)]. Alternatively, both end point references can be trimmed down by 0.5 mV to get −0.5, +1.5, −1.5, +1.5 and −0.5 mV error to minimize the worst case error for this section. However, these reference trims are also part of adjacent sections that, when trimmed, will affect the errors of those adjacent sections. There is no way to compensate for each threshold error without putting a reference trim at every comparator. This is impractical if not impossible for large resolution ADCs.

The present invention provides a novel method for trimming each comparator individually. For an ADC, there are $2^N-1$ discrete thresholds. These thresholds are the digital code transitions for the ADC. To achieve high resolution, these thresholds ideally should be spaced equally. Without any trim capability, these thresholds will be far from ideal and these non-linearities will degrade the ability to accurately convert an analog signal into a digital representation. For an 8-bit flash quantizer, there are 255 thresholds and 256 codes. The idea of this invention is to incorporate a trimmable offset capability for every single comparator threshold. The technique does not affect the signal path and is a DC trim. Instead of trimming the actual threshold voltages that are input to the comparators (i.e. trimming the resistor ladder), which is the conventional approach (as shown in FIGS. 2 and 3), the novel technique of the present invention trims out any threshold errors as well as any comparator offset errors—from within the preamplifiers of the comparators.

Figure 4:
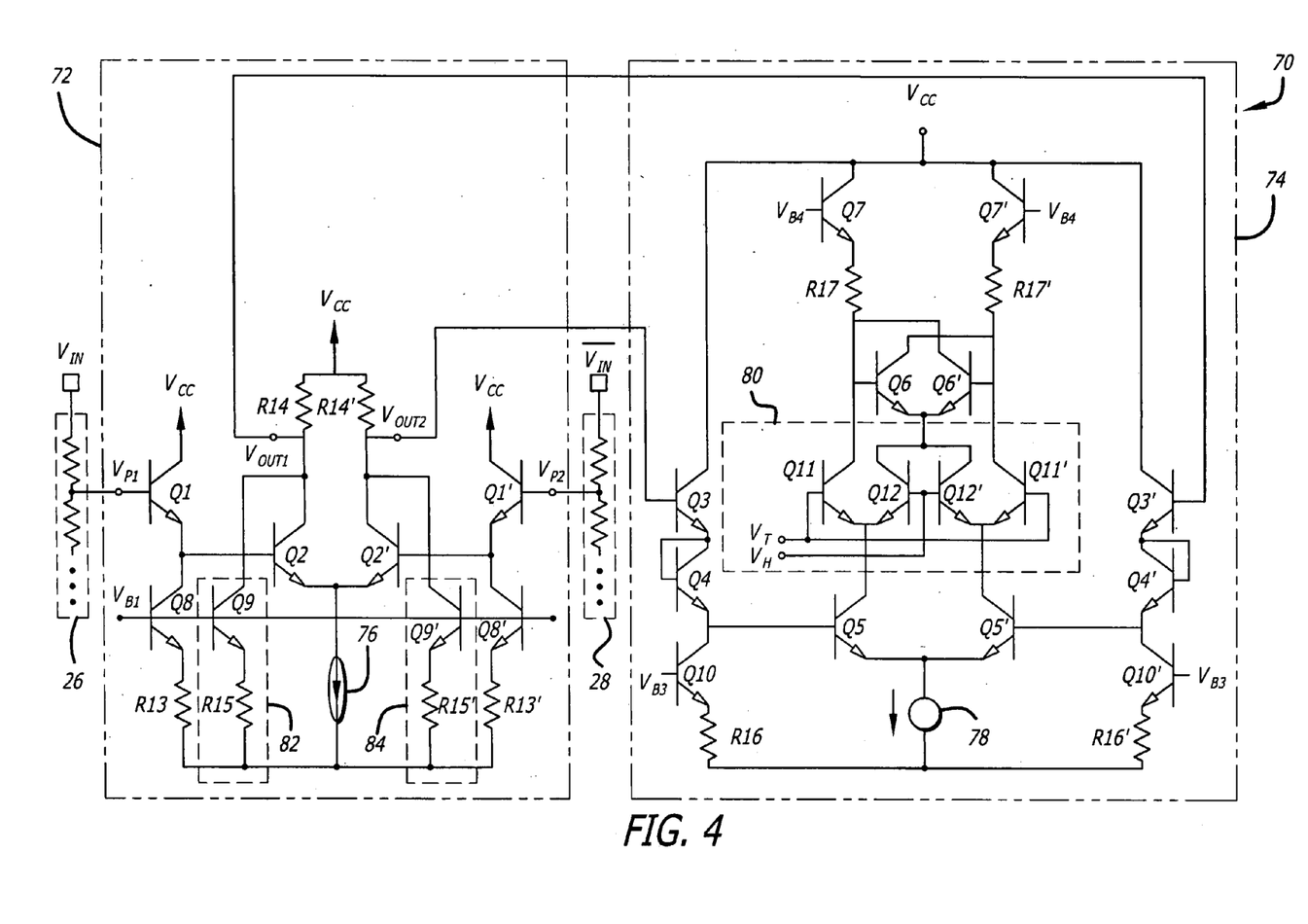
FIG. 4 is a simplified schematic of an illustrative embodiment of a trimmable comparator designed in accordance with the teachings of the present invention.

FIG. 4 is a simplified schematic of an illustrative embodiment of a trimmable comparator 70 designed in accordance with the teachings of the present invention. Comparators of this type of design may be used in a single-ended flash ADC (as shown in FIG. 1a) or a differential flash ADC (as shown in FIG. 1b) to reduce DNL and INL errors. The novel comparator may also be used in other types of circuits, other than ADCs, without departing from the scope of the present teachings.

The comparator 70 includes an input or preamplifier (preamp) circuit 72 and an output circuit 74. The preamp 72 includes two input transistors Q1 and Q1' adapted to receive a first input signal $V_{P1}$ and a second input signal $V_{P2}$, respectively, and output them to a differential amplifier comprised of transistors Q2 and Q2'. The inputs $V_{P1}$ and $V_{P2}$ are the inputs to the comparator 70, and may include the analog input signal $V_{IN}$ and a threshold voltage tapped from a resistor ladder (as in a single-ended ADC as shown in FIG. 1a), or the voltages tapped from two resistor ladders (as in a differential ADC as shown in FIG. 1b). The example of FIG. 4 shows the differential implementation with inputs from the resistor ladders 26 and 28.

The collectors of Q1 and Q1' are coupled to a voltage supply $V_{CC}$. The emitter of Q1 is coupled to the base of Q2 and a current source, comprised of a transistor Q8 and resistor R13, and the emitter of Q1' is coupled to the base of Q2' and a current source, comprised of a transistor Q8' and resistor R13'. The bases of Q8 and Q8' are coupled to a bias voltage $V_{B1}$. The emitters of Q2 and Q2' are connected in common to a current source 76. The collectors of Q2 and Q2' are connected to the preamp output nodes $V_{OUT1}$ and $V_{OUT2}$, respectively, which are coupled to $V_{CC}$ through resistors R14 and R14', respectively.

The comparator output circuit 74 includes two transistors Q3 and Q3' adapted to receive the preamp output signals $V_{OUT1}$ and $V_{OUT2}$ from the preamplifier 72. The collectors of Q3 and Q3' are coupled to $V_{CC}$, and the emitters are coupled to diode connected transistors Q4 and Q4', respectively. The emitter of Q4 is connected to the base of a transistor Q5 and to a current source, comprised of a transistor Q10 and a resistor R16. The emitter of Q4' is connected to the base of a transistor Q5' and to a current source, comprised of a transistor Q10' and a resistor R16'. The bases of Q10 and Q10' are coupled to a bias voltage $V_{B3}$. The emitters of Q5 and Q5' are connected in common to a current source 78, and the collectors are input to a clock circuit 80, comprised of transistors Q11, Q12, Q11', and Q12'. The clock 80 is adapted to couple the outputs of the differential amplifier Q5, Q5' to the inputs of a differential pair comprised of transistors Q6 and Q6' during a track mode.

Transistors Q11 and Q12 are a differential pair having emitters connected in common to the collector of Q5. Transistors Q11' and Q12' are a differential pair having emitters connected in common to the collector of Q5'. The collectors of Q11 and Q11' are coupled to the bases of Q6 and Q6', respectively, and the collectors of Q12 and Q12' are connected to the common emitters of Q6 and Q6'. The bases of Q11 and Q11' are coupled to a track signal $V_T$, and the bases of Q12 and Q12' are coupled to a hold signal $V_H$, which is complementary to $V_T$. The collector of Q6 is connected to the base of Q6', and to the emitter of a transistor Q7' by a resistor R17'. The collector of Q6' is connected to the base of Q6, and to the emitter of a transistor Q7 by a resistor R17. The collectors of Q7 and Q7' are connected to $V_{CC}$, and the bases of Q7 and Q7' are coupled to a bias voltage $V_{B4}$.

The novelty of the comparator 70 lies in the preamplifier 72. In accordance with the present teachings, the preamp 72 also includes a first circuit 82 for applying a first adjustable current to the preamp output node $V_{OUT1}$, and a second circuit 84 for applying a second adjustable to the preamp output node $V_{OUT2}$. In the embodiment of FIG. 4, the first circuit 82 includes a current source comprised of a transistor Q9 and a trimmable resistor R15, and the second circuit 84 includes a current source comprised of a transistor Q9' and a trimmable resistor R15'. The collector of Q9 is coupled to $V_{OUT1}$, and the emitter connected to one end of resistor R15, the other end of which is connected to ground (or a negative power supply $V_{EE}$). The collector of Q9' is coupled to $V_{OUT2}$, and the emitter connected to one end of resistor R15', the other end of which is connected to ground (or $V_{EE}$). The bases of Q9 and Q9' are coupled to $V_{B1}$. The resistors R15 and R15' can be trimmed using laser trimming or any other suitable method.

All of the sources of offset errors that affect a comparator's switching threshold can be referred back to the input of the preamp. Since the preamp has gain, this offset error (input offset error multiplied by the gain of the preamp) can also be seen at the load resistors R14 and R14'. By adding trimmable current sources 82 and 84 connected to these load resistors, offset can be added to either side to force the preamp-comparator to have a threshold that is nearly ideal. Knowing the process variation and device mismatches, a maximum error at the load resistors can be calculated and a range set for the current trims.

The input signals $V_{P1}$ and $V_{P2}$ can be moved (by adjusting $V_{IN}$ in a single-ended ADC, or $V_{IN}$ and $\overline{V}_{IN}$ in a differential ADC) to a voltage to determine the code transition (comparator threshold) using a sampling voltage tracker. This is done for every code transition in the N-bit ADC. The deviation from the ideal threshold is the error. If the threshold error is too high for a particular comparator (threshold), the inputs ($V_{IN}$ and $\overline{V}_{IN}$) are adjusted to the ideal threshold. The preamp output at $V_{OUT1}$ would be too low relative to $V_{OUT2}$. To compensate for this, the resistor R15 is actively laser trimmed to decrease the current through Q9, which reduces the current through R14. With the decrease in current, $V_{OUT1}$ moves up relative to $V_{OUT2}$, and the trimming is stopped when the comparator code transition point is reached. If the threshold error is too low, then the reverse would be true and resistor R15' would be trimmed to reduce the voltage across R14', thereby raising $V_{OUT2}$.

Figure 5:
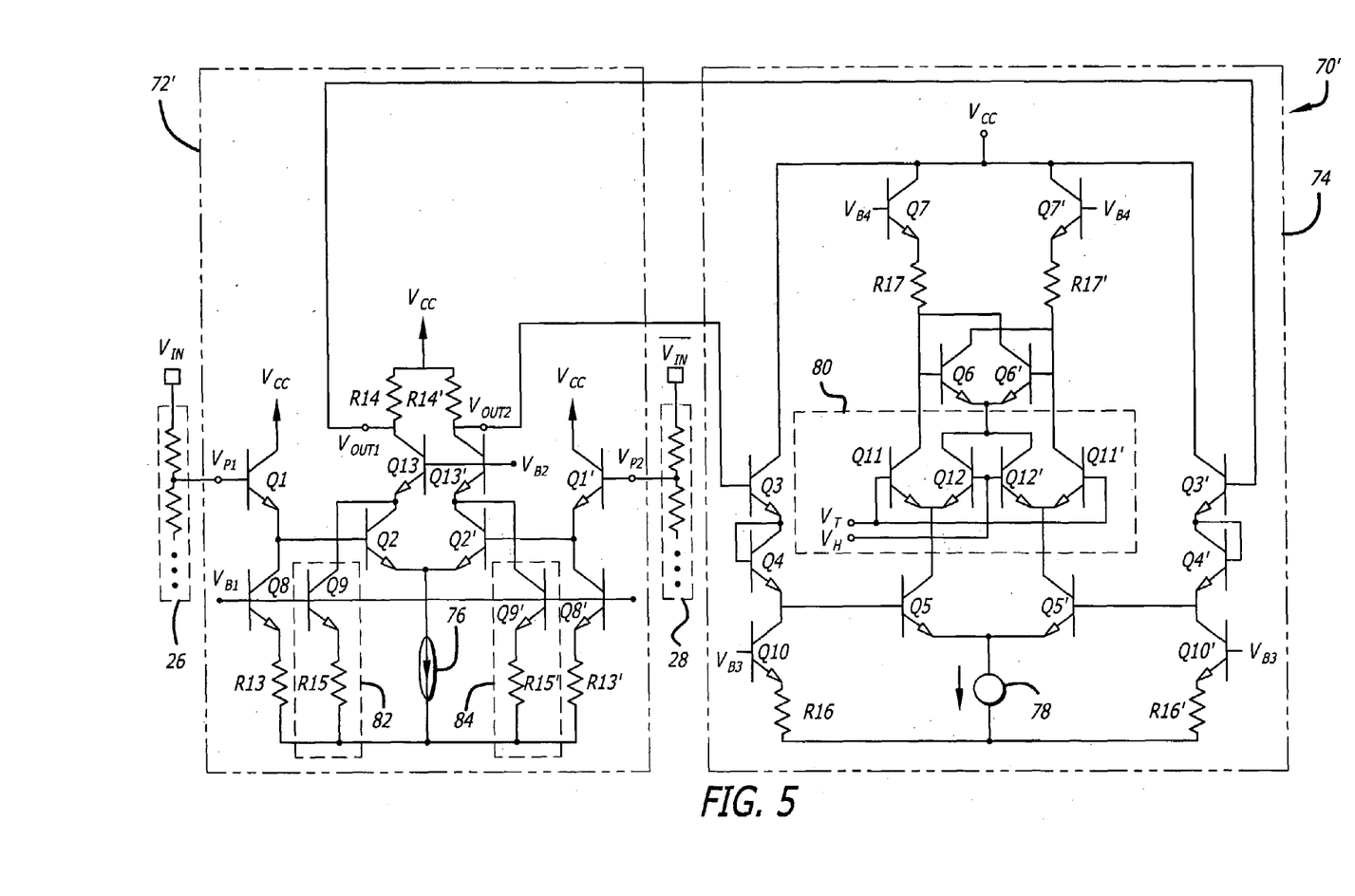
FIG. 5 is a simplified schematic of an alternative embodiment of a trimmable comparator designed in accordance with the teachings of the present invention.

FIG. 5 is a simplified schematic of an alternative embodiment of a trimmable comparator 70' designed in accordance with the teachings of the present invention. The difference between the embodiment of FIG. 5 and that of FIG. 4 is the addition of two cascode transistors Q13 and Q13' to the preamplifier 72', used to effectively isolate the collector base $C_{jc}$ and collector to substrate $C_{js}$ capacitances of the trim transistors Q9 and Q9' from the signal path. As shown in FIG. 5, the collector of Q2 is now coupled to the emitter of Q13, and the collector of Q13 is coupled to the preamp output node $V_{OUT1}$, which is connected to resistor R14. The collector of Q2' is coupled to the emitter of Q13', and the collector of Q13' is coupled to the preamp output node $V_{OUT2}$, which is connected to resistor R14'. The bases of Q13 and Q13' are coupled to a bias voltage $V_{B2}$.

Since the emitters of Q13 and Q13' clamp the collector voltages of Q9 and Q9' to $V_{B2}$–0.8 V, this alternate implementation improves the settling time of the comparator 70'. Other than this improved settling time, the circuit functions as previously described.

Figure 6:
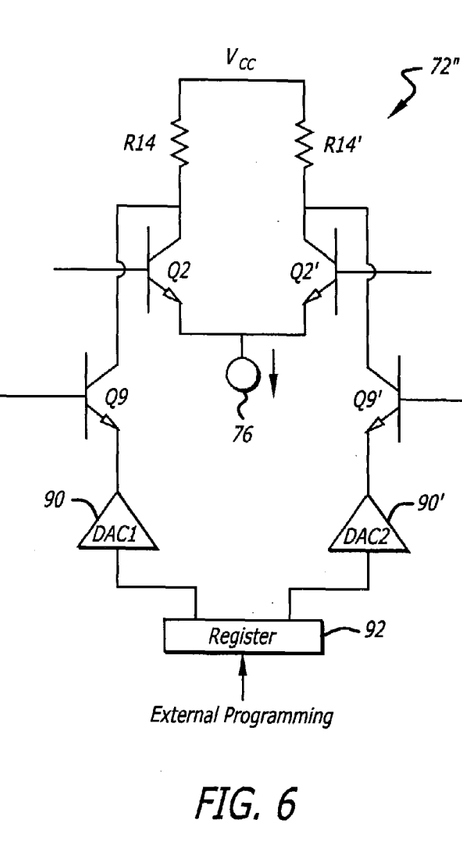
FIG. 6 is a simplified schematic of an alternative embodiment of a trimmable comparator preamplifier designed in accordance with the teachings of the present invention.

FIG. 6 is a simplified schematic of an alternative embodiment of a trimmable comparator preamplifier 72" designed in accordance with the teachings of the present invention. In general, the trimming approach of the present invention involves injecting trimmable currents at the outputs of the comparator preamp. In the embodiments of FIGS. 4 and 5, the trimmable currents are supplied by current sources formed from transistors and trimmable resistors. The trimmable currents, however, may be provided using other circuits, such as digital to analog converters (DACs). In the embodiment of FIG. 6, the trimmable resistors R15 and R15' are replaced with two separate addressable calibration DACs 90 and 90', respectively. The DACs are designed to cover the adjustment range and resolution required to compensate for the anticipated process variations. An externally programmable register 92 is used to supply the digital codes input to the DACs 90 and 90'. In the embodiment shown in FIG. 6, the DACs 90 and 90' are resistive DACs. Other implementations and types of DACs can be used without departing from the scope of the present teachings. For example, current output DACs can be used to provide the adjustable currents at the preamp outputs $V_{OUT1}$ and $V_{OUT2}$, replacing the trim transistors Q9 and Q9' and the trimmable resistors R15 and R15' of the embodiments of FIGS. 4 and 5.

This digital approach, which does not require the use of a laser, therefore digitally adjusts a current that sets a quantizer threshold voltage in conjunction with a resistor material type than cannot be trimmed with a laser, such as poly silicon. This approach eliminates the problems associated with laser trimming such as spot size, laser step size, and the design and layout of the resistor itself. In addition, the digital trim approach can be accomplished after packaging.

Thus, the novel method of the present invention for reducing DNL and INL errors in a flash ADC involves trimming the comparators of the ADC instead of the conventional approach of trimming the resistive ladders that provide the threshold inputs to the comparators. Each comparator is independently trimmed by injecting adjustable currents at the outputs of the preamplifier of the comparator. The comparator trim is accomplished by wafer trimming one of two trimmable resistors for each comparator, or by digitally adjusting the currents using externally programmable DACs. Both techniques allow each individual comparator threshold to be trimmed to almost zero error. The novel approach may be used for both single-ended and differential ADC implementations.

Thus, the present invention has been described herein with reference to a particular embodiment for a particular application. Those having ordinary skill in the art and access to the present teachings will recognize additional modifications, applications and embodiments within the scope thereof. For example, while the illustrative embodiments have been described using NPN bipolar transistors, other process technologies may be used without departing from the scope of the present teachings.

It is therefore intended by the appended claims to cover any and all such applications, modifications and embodiments within the scope of the present invention.

Accordingly,

What is claimed is:

1. A comparator comprising:
    first means for comparing first and second input signals and in accordance therewith generating first and second output signals;
    second means for adding an adjustable current to said first output signal such that said comparator is in a transition state when said first and/or second input signals are at a predetermined level, said second means includes a first adjustable current source; and
    third means for adding an adjustable current to said second output signal, wherein said third means includes a second adjustable current source,
    wherein said first adjustable current source includes a first transistor having a first output coupled to said first output signal and a second output coupled to a first trimmable resistor.

2. The invention of claim 1 wherein said second adjustable current source includes a second transistor having a first output coupled to said second output signal and a second output coupled to a second trimmable resistor.

3. The invention of claim 1 wherein said first and second output signals are coupled to a voltage supply through first and second resistors, respectively.

4. The invention of claim 1 wherein said first means includes a differential amplifier comprising a first and a second transistor.

5. The invention of claim 4 wherein said comparator further includes two input transistors adapted to receive said first and second input signals, respectively, and output said first and second input signals to said differential amplifier.

6. A comparator comprising:
    first means for comparing first and second input signals and in accordance therewith generating first and second output signals;
    second means for adding an adjustable current to said first output signal such that said comparator is in a transition state when said first and/or second input signals are at a predetermined level; and
    third means for adding an adjustable current to said second output signal,
    wherein said second means includes a first digital to analog converter.

7. The invention of claim 6 wherein said third means includes a second digital to analog converter.

8. The invention of claim 7 wherein said comparator further includes an externally programmable register adapted to provide digital codes input to said first and second digital to analog converters.

9. The invention of claim 7 wherein said second digital to analog converter is a resistive digital to analog converter.

10. The invention of claim 9 wherein said third means further includes a transistor having a first output coupled to said second output signal and a second output coupled to an output of said second digital to analog converter.

11. The invention of claim 6 wherein said first digital to analog converter is a resistive digital to analog converter.

12. The invention of claim 11 wherein said second means further includes a transistor Q9 having a first output coupled to said first output signal and a second output coupled to an output of said first digital to analog converter.

13. A comparator comprising:
    first means for comparing first and second input signals and in accordance therewith generating first and second output signals;
    second means for adding an adjustable current to said first output signal such that said comparator is in a transition state when said first and/or second input signals are at a predetermined level; and
    third means for adding an adjustable current to said second output signal,
    wherein said first and second output signals are coupled to a voltage supply through first and second resistors, respectively, and
    wherein said comparator further includes fourth means for isolating parasitic capacitances generated by said second and third means from the signal path.

14. The invention of claim 13 wherein said fourth means includes a first and a second transistor connected in a cascode configuration.

15. The invention of claim 14 wherein one of said first and second cascode transistors is connected between the output of said second means and said first resistor.

16. The invention of claim 15 wherein the other one of said first and second cascode transistors is connected between the output of said third means and said second resistor.

17. A comparator comprising:
    a differential amplifier adapted to compare first and second input signals and in accordance therewith generate first and second output signals, said differential amplifier including a first and a second transistor having emitters connected in common to a first current source;
    a first circuit for adding an adjustable current to said first output signal, said first circuit includes a first circuit transistor having a collector coupled to the collector of one of said first and second transistors; and
    a second circuit for adding an adjustable current to said second output signal, such that said comparator is in a transition state when said first and/or second input signals are at a predetermined level, said second circuit including a second circuit transistor having a collector coupled to the collector of the other one of said first and second transistors,
    wherein an emitter of the first circuit transistor is coupled to a first trimmable resistor.

18. The invention of claim 17 wherein an emitter of the second circuit transistor is coupled to a second trimmable resistor.

19. The invention of claim 17 wherein said comparator further includes a first and a second input transistor adapted to receive said first and second input signals, respectively, and couple them to the bases of the first and second transistors of said differential amplifier, respectively.

20. A comparator comprising:
    a differential amplifier adapted to compare first and second input signals and in accordance therewith generate first and second output signals;
    a first circuit for adding an adjustable current to said first output signal; and
    a second circuit for adding an adjustable current to said second output signal, such that said comparator is in a transition state when said first and/or second input signals are at a predetermined level,
    wherein said differential amplifier is comprised of a first and a second transistor having emitters connected in common to a first current source,
    wherein said first circuit includes a first circuit transistor having a collector coupled to the collector of one of said first and second transistors,
    wherein said second circuit includes a second circuit transistor having a collector coupled to the collector of the other one of said first and second transistors, and
    wherein an emitter of the first circuit transistor is coupled to a first digital to analog converter.

21. The invention of claim 20 wherein an emitter of the second circuit transistor is coupled to a second digital to analog converter.

22. A comparator comprising:
    a differential amplifier adapted to compare first and second input signals and in accordance therewith generate first and second output signals;
    a first circuit for adding an adjustable current to said first output signal; and
    a second circuit for adding an adjustable current to said second output signal, such that said comparator is in a transition state when said first and/or second input signals are at a predetermined level,
    wherein said differential amplifier is comprised of a first and a second transistor having emitters connected in common to a first current source, and
    wherein said first circuit includes a first digital to analog converter.

23. The invention of claim 22 wherein said second circuit includes a second digital to analog converter.

24. The invention of claim 23 wherein said comparator further includes an externally programmable register adapted to provide digital input codes to said first and second digital to analog converters.

25. A comparator comprising:
a differential amplifier adapted to compare first and second input signals and in accordance therewith generate first and second output signals;
a first circuit for adding an adjustable current to said first output signal; and
a second circuit for adding an adjustable current to said second output signal, such that said comparator is in a transition state when said first and/or second input signals are at a predetermined level,
wherein said differential amplifier is comprised of a first and a second transistor having emitters connected in common to a first current source, and
wherein the collectors of said first and second transistors are coupled to a voltage supply through a first and a second resistor, respectively.

26. The invention of claim 25 wherein said comparator further includes a pair of transistors connected in a cascode configuration.

27. The invention of claim 26 wherein one of said transistors connected in a cascode configuration has an emitter coupled to the collector of said first transistor of said differential amplifier, and a collector coupled to said first resistor.

28. The invention of claim 26 wherein the other one of said transistors connected in a cascode configuration has an emitter coupled to the collector of said second transistor of said differential amplifier and a collector coupled to said second resistor.

* * * * *